United States Patent [19]

Brown

[11] 4,276,613
[45] Jun. 30, 1981

[54] CLOSE-PACKED BUBBLE PROPAGATION DEVICE

[75] Inventor: Byron R. Brown, San Jose, Calif.

[73] Assignee: International Business Machines Corporation, Armonk, N.Y.

[21] Appl. No.: 954,132

[22] Filed: Oct. 23, 1978

[51] Int. Cl.³ ............................................. G11C 13/08
[52] U.S. Cl. ......................................... 365/14; 365/3; 365/39; 365/41; 365/17
[58] Field of Search ............................. 365/3, 13–16, 365/23, 39, 41, 43

[56] References Cited

U.S. PATENT DOCUMENTS

| 4,020,476 | 4/1977 | Bonyhard et al. | 365/41 |
| 4,133,045 | 1/1979 | Littwin | 365/39 |
| 4,164,026 | 8/1979 | Almasi et al. | 365/3 |

Primary Examiner—James W. Moffitt
Attorney, Agent, or Firm—Joseph E. Kieninger

[57] ABSTRACT

A close-packed magnetic bubble propagation device includes a pattern having a plurality of propagation elements positioned in at least four adjacent rows. These elements are spaced to provide a period or spacing of bubbles in these rows of less than three bubble diameters. Upon application of a rotating in-plane field to the elements, bubbles in adjacent rows move in opposite directions. A preferred embodiment of this propagation device has at least two storage loops which contain at least four adjacent horizontal rows of propagation elements. A preferred device utilizing this pattern has at least two storage loops and an access path which passes through each of the loops. An electrical conductor is associated with the propagation elements in the access path so that the passing of a current through the conductor together with the application of an in-plane rotating field to the elements causes bubbles associated with the elements in the access path to move along the access path. Preferably, the pattern is surrounded by an array of confinement elements which confine the bubbles to the storage loops and the access path.

11 Claims, 12 Drawing Figures

CLOSE-PACKED BUBBLE PROPAGATION DEVICE

DESCRIPTION

1. Technical Field

This invention relates to a bubble propagation device and more particularly to a close-packed bubble propagation device.

It is a primary object of this invention to provide an improved bubble propagation device.

It is another object of this invention to provide a close-packed bubble propagation device.

It is still another object of this invention to provide an improved storage loop pattern.

It is yet still another object of this invention to provide a progagation pattern suitable for use in a close-packed bubble device.

It is a further object of this invention to provide a close-packed pattern that permits adjacent rows of bubbles to move in opposite directions.

2. Background Art

Bubble domains arranged in a close-packed lattice are described in U.S. Pat. Nos. 3,930,244 and 4,052,710 which are assigned to the assignee of the present invention. The aforementioned patents are incorporated herewith by reference thereto. As described therein, the close-packed bubble domain lattice which stores data by means of the wall state of the bubbles, consists of a plurality of rows and columns of bubble domains which occupy a spatial arrangement that is determined to a substantial extent by the interaction between the bubbles. This interaction between the bubbles requires that the period or spacing of the bubbles be less than three bubble diameters. Bubble systems having a period or spacing of bubbles of less than three bubble diameters are classified as close-packed in contrast to conventional bubble diameters.

Close-packed bubble domain lattices are primarily in the form of a regular array in which each bubble is surrounded by six adjacent neighboring bubbles. In many of these bubble domain lattice system designs all of the bubbles in the lattice are translated in mass in the same direction parallel to the rows of the storage axis with current conductors to position the addressed bubbles in an access channel. When the column of bubbles is in the access channel, these bubbles can be translated within the lattice along the channel. Such translation along the column axis is used to enter new bubbles into the lattice to remove existing bubbles from the lattice.

In other close-packed bubble domain lattice system designs all of the bubbles in the lattice are translated in mass in the same direction parallel to the rows of the storage axis with the application of an external rotating in-plane field. Such systems are described in U.S. Pat. Nos. 4,034,357 and in 4,028,685 which are assigned to the assignee in the present invention.

New approaches involving a closed loop close-packed lattice system are described in U.S. Pat. No. 3,953,841 and in the pending patent application Ser. No. 917,611 filed June 21, 1978 now U.S. Pat. No. 4,172,290, and which are assigned to the assignee of the present invention. In the above-identified patent, the bubble lattice system has a curved portion therein wherein the lattice parameter increases with the radius. In the aforementioned pending patent application, the close-packed bubble lattice system has a closed loop propagation pattern which is folded and contains, for example, segments of a hexagonal lattice connected by 60° turns to obtain a close-packed bubble storage configuration. The bubbles are propagated in mass in one direction along one side of the pattern or loop and in mass in the opposite direction along the other side of the pattern or loop by a rotating magnetic field in the plane of the pattern.

In contrast to the close-packed bubble lattice systems, the conventional isolated bubble device typically utilizes chevrons or C-bars of the type described in the patent to Bonyhard et al, U.S. Pat. No. 4,014,009 in a major/minor loop organization of the type described in the patent to Bhandarker U.S. Pat. No. 3,999,172. The major/minor loop organization described in Bhandarkar may utilize paths of minor loop end bars of the type described in the patent to George et al U.S. Pat. No. 4,079,461. The conventional bubble systems which store data by the presence of or absence of bubbles are not close-packed since they normally have a period of four to five bubble diameters. Smaller periods result in unstable systems due to the mutual repulsion of adjacent bubbles.

BRIEF DESCRIPTION OF THE DRAWING

In the accompanying drawings forming a material part of this disclosure.

DISCLOSURE OF THE INVENTION

For a further understanding of the invention and of the object and advantages thereof, reference will be made to the following description and accompanying drawings, and to the appended claims in which the various novel features of the invention are more particularly set forth.

A close-packed magnetic bubble propagation pattern includes a plurality of propagation elements positioned in at least four adjacent rows. These elements, to be close-packed, must be spaced to provide a period or spacing of bubbles in and between these rows of less than three bubble diameters. Preferably, the elements are C-bar type or chevron-type magnetic elements. Upon application of a rotating in-plane field to these elements, bubbles in adjacent rows move in opposite directions. A preferred embodiment of this propagation pattern has at least two storage loops which contain at least four adjacent horizontal rows of propagation elements.

A preferred device utilizing this pattern has at least two storage loops, one or more access paths which pass through each of the loops and each access path has an access switch to propagate bubbles in the access paths. In a preferred embodiment the access switch is an electrical conductor which is associated with the propagation elements in the access path so that the passing of the current through the conductor together with the application of an in-plane rotating field to the elements causes bubbles associated with these elements in the access path to move along the access path. Typically, a bubble generator and bubble state coder are at one end of the access path and a bubble state discriminator and a bubble detector are at the other end of the access path. Preferably, the pattern is surrounded by an array of confinement elements which confine the bubbles to the storage loop and the access path.

BEST MODE FOR CARRYING OUT THE INVENTION

Figure 1:
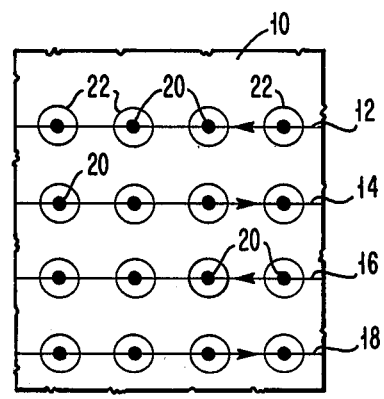
FIG. 1 is a schematic view illustrating the close-packed bubble pattern in accordance with this invention.

As shown in FIG. 1, the close-packed bubble propagation pattern 10 consists of a plurality of rows 12, 14, 16 and 18 containing propagation elements 20. The propagation elements 20 are preferably of the C-bar type or Chevron-type and of a magnetic material such as permalloy. These elements are spaced to provide a period or spacing of bubbles 22 in and between these rows of less than three bubble diameters. Preferably, this spacing is about two bubble diameters. A bubble propagation pattern in which the period is less than three bubbles diameters is referred to as a close-packed pattern. Upon application of a rotating in-plane field to the elements 20, bubbles 22 in rows 12 and 16 will move in one direction while bubbles 20 in rows 14 and 18 will move in the opposite direction.

Figure 2:
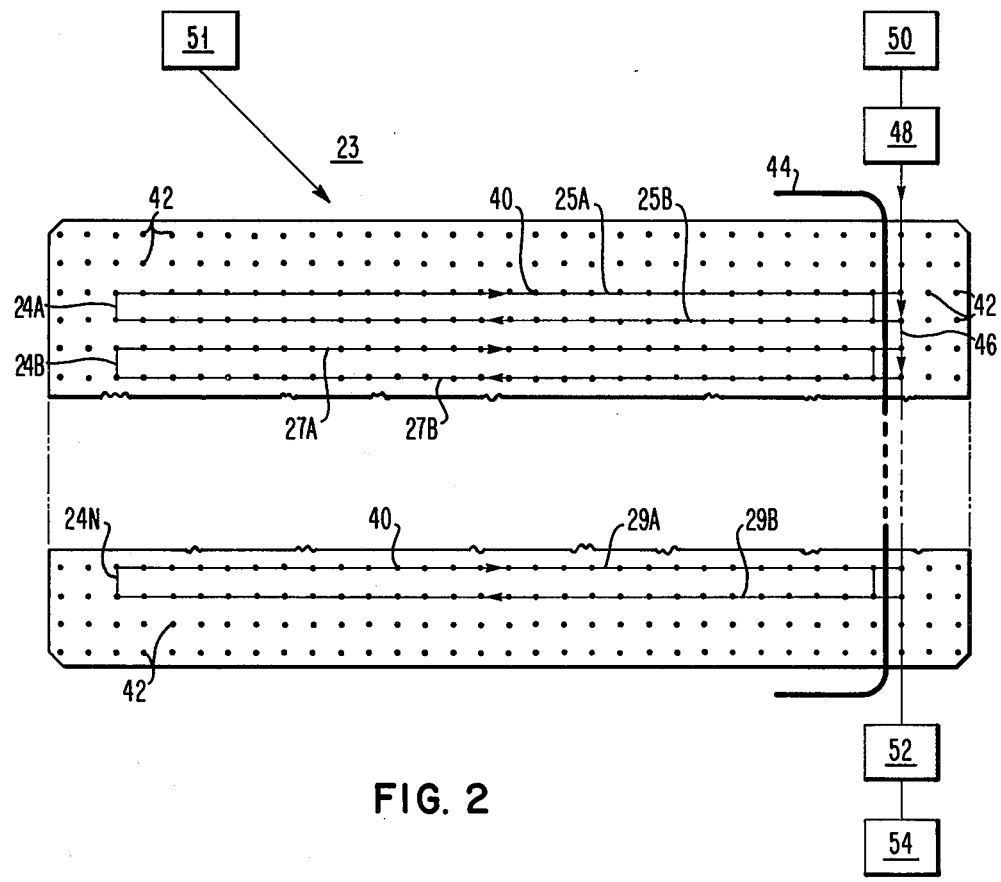
FIG. 2 is a schematic view of a close-packed bubble device.

A schematic view of a close-packed bubble device having such a propagation pattern is shown in FIG. 2. The bubble device 23 has a plurality of minor loops 24A, 24B and 24N which have a top row of elements 25A, 27A and 29A and a bottom row of elements 25B, 27B and 29B. The rows 25A through 29A and 25B through 29B contain a plurality of magnetic elements 40. Surrounding the minor loops 24A–24N are a plurality of confinement magnetic elements 42 which confine the bubbles in the minor loops 24A–24N. All of the elements 40 in the storage loops and the confinement elements 42 have a bubble (not shown) associated therewith. An access switch 44 passes through the minor loops 24A through 24N. An access path 46 passes through the elements 40 at the end of minor loops 24A–24N. Bubble state coder 48 and bubble generator 50 are connected to one end of access path 46 and bubble state discriminator 52 and bubble detector 54 are connected to the other end of access path 46. Means 51 provides a rotating in-plane field to the elements 40 and 42, coder 48, generator 50, discriminator 52 and detector 54.

Figure 3:
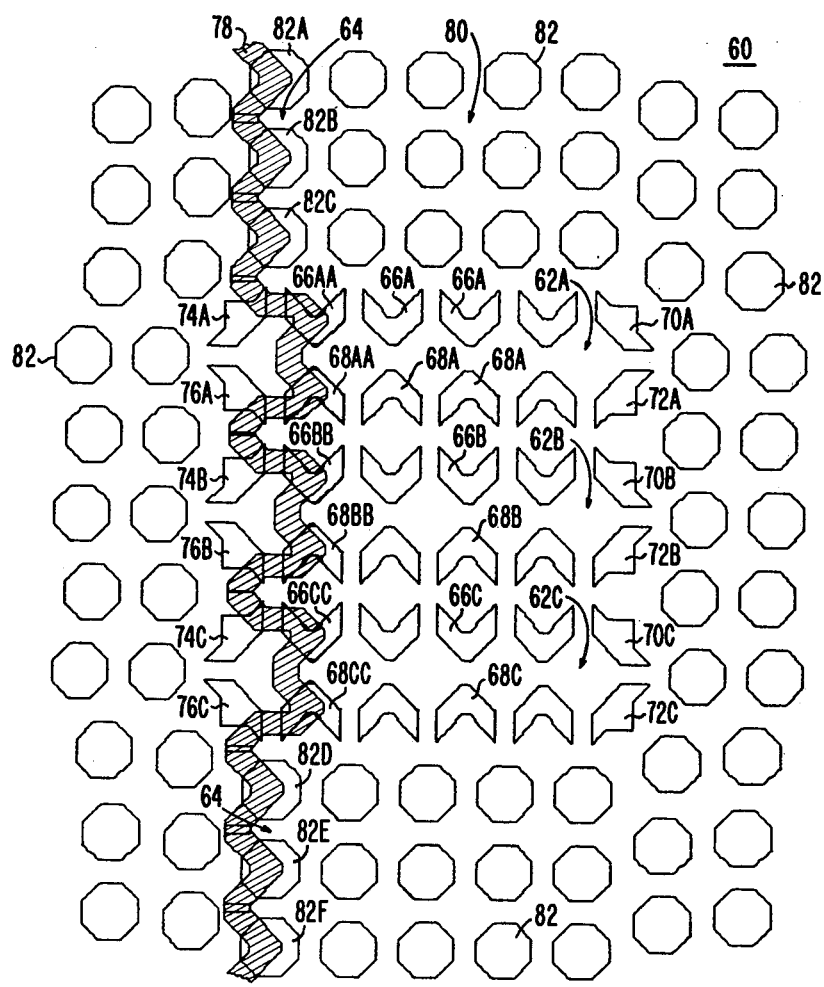
FIG. 3 is an elevational view illustrating a portion of a close-packed bubble device with one access path.
Figure 4A:
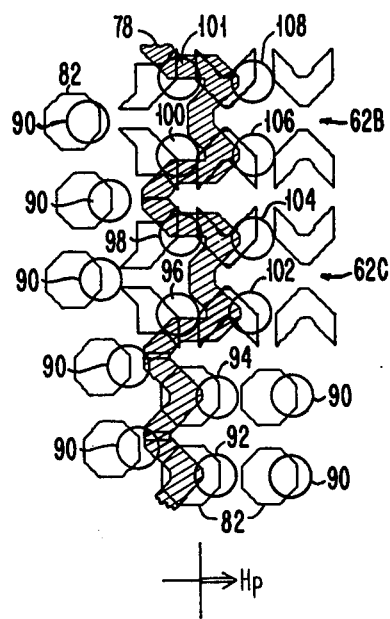
FIGS. 4A through 4D are elevational views illustrating the change of bubble position on the pattern as the in-plane field is rotated with no current in the conductor.
Figure 4B:
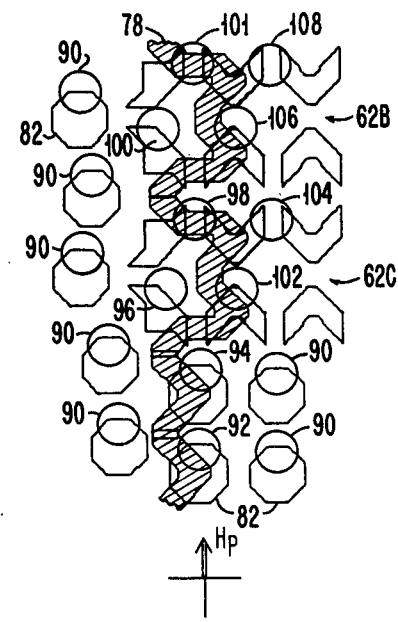
Figure 4C:
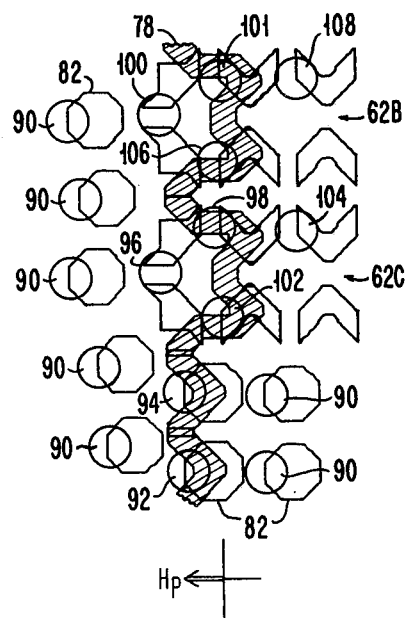
Figure 4D:
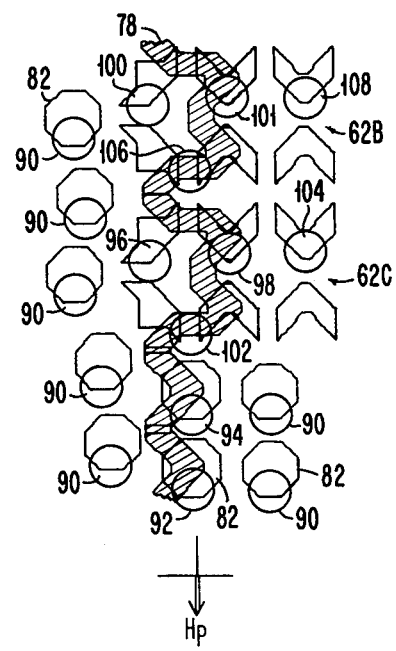

As shown in FIG. 3, the close-packed bubble device 60 consists of a plurality of storage loops 62A, 62B and 62C and an access path 64. While only three storage loops 62A, 62B and 62C are shown, it is understood that the number of storage loops can be increased substantially and is determined by a number of factors such as available space, and so forth, which will not be described here. The storage loops 62A–62C contain a row of magnetic propagation magnetic elements 66A, 66B and 66C respectively, which are positioned across from a row of magnetic propagation elements 68A, 68B and 68C respectively. The propagation elements 66A, 66B, 66C and 68A, 68B and 68C are preferably of the C-bar or Chevron-type. In storage loop 62A the row of magnetic elements 66A and the row of magnetic elements 68A are connected at one end with corner elements 70A and 72A and at the other end by corner elements 74A and 76A. Similarly, in storage loops 62B and 62C, elements 66B, 66C and elements 68B, 68C are connected at one end with corner elements 70B and 72B and 70C and 72C respectively, and at the other end with corner elements 74B and 76B and 74C and 76C respectively. The shape of the corner elements 70A–C, 72A–C, 74A–C and 76A–C may have the shape shown in FIG. 3 or a shape that is suitable for guiding the propagation of a bubble from one row of horizontal elements to the second row of horizontal elements.

In a preferred embodiment, an electrical conductor 78 is associated with the corner elements 74A–C and 76A–C and with the adjacent propagation elements 66AA, 68AA, 66BB, 68BB, 66CC and 68CC in the storage loops as shown in FIG. 3. The device illustrated in FIG. 3 includes an array 80 of magnetic confinement elements 82 which surrounds the storage loops 62A–C. The array 80 is shown to be two rows thick in some places and three rows thick in others. In practice it is usually four to eight rows thick.

The close-packed storage device shown in FIG. 3 works as follows. In the absence of a current passing through conductor 78, bubbles will propagate around the storage loop going, for example, in storage loop 62A, along the elements 66A over elements 70A and 72A to the adjacent element 68A and along the elements 68A to 68AA and to the corner elements 76A and 74A and then to element 66AA. The bubbles will rotate along the described path as long as the in-plane field is rotated. This bubble movement is more fully illustrated in FIGS. 4A–D.

As shown in FIGS. 4A through 4D, the change of bubble position on the storage loop is shown as the inplane field is rotated in the absence of a current passing through the conductor 78. The confinement bubbles 90 rotate around the idle elements 82 and are not propagated away from the particular element to which they are associated. The bubbles 92 and 94 also rotate around the idle elements to which they are associated. The bubbles 106, 100, 101 and 108 rotate around storage loop 62B as shown. Similarly, bubbles 102, 96, 98 and 104 rotate around storage loop 62C as shown.

Figure 5A:
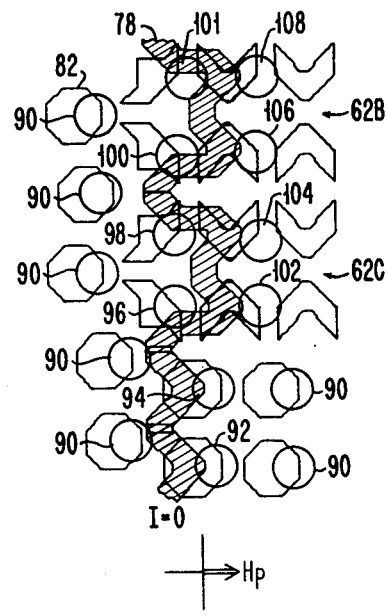
FIGS. 5A through 5D are elevational views illustrating the change of bubble position on the pattern as the in-plane field is rotated with current in the conductor.
Figure 5B:
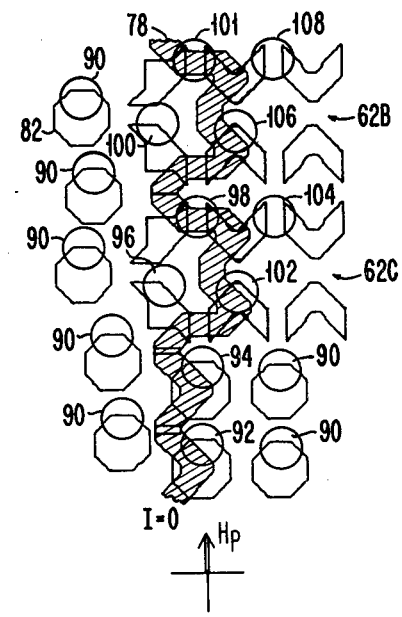
Figure 5C:
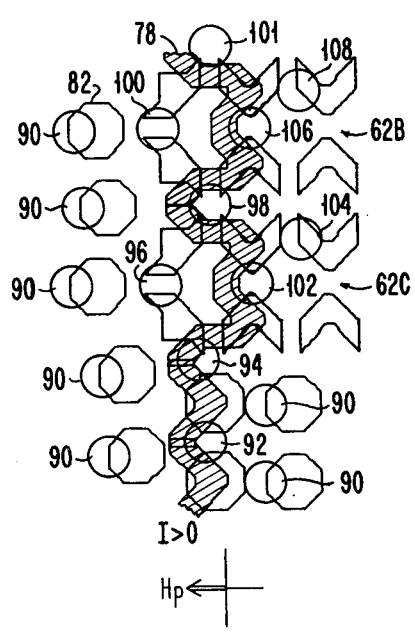
Figure 5D:
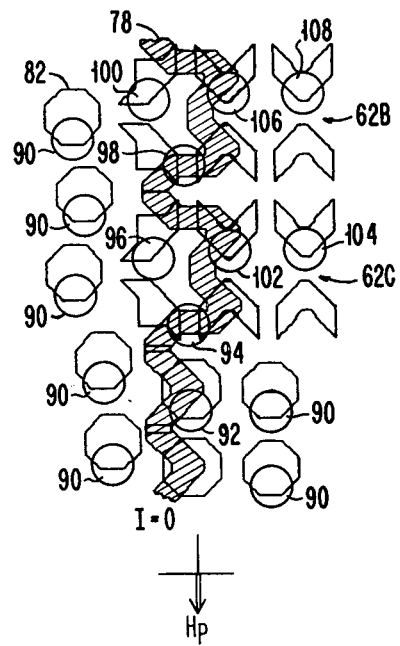

Passing current through the conductor 78 results in the storage loops 62A–C being shorter. For example, as shown in FIG. 3, storage loop 62A no longer includes the corner elements 74A and 76A since that end of storage loop 62A is provided by adjacent elements 66AA and 68AA. The access path in this situation includes the corner elements 74A–C and 76A–C and propagation elements 66AA–CC and 68AA–CC as well as elements 82A–F. The corner elements 74A–C and 76A–C and storage loop propagation elements 66AA–CC and 68AA–CC serve a dual roll. That is, they function as part of the access path when current is passing through the conductor 78. In addition, when a current is not passing through the conductor 78, the elements 74A–C and 76A–C, 66AA–CC and 68AA–CC function as part of the storage loops 62A–C. As shown in FIGS. 5C through 5D, the change of bubble position on the pattern is shown as the in-plane field is rotated while a current is being passed through the conductor 78. The confinement bubbles 90 rotate around the idle elements 82 and are not propagated away from the particular element to which they are associated. The bubbles 92, 94, 96, 98, 100 and 101 are positioned along elements which provide an access path while the current is passing through the conductor 78. As the inplane field is rotated one complete revolution going from FIG. 5A through 5D, the bubble moves accordingly from the one elements to the adjoining element. It is necessary to have two complete revolutions of the in-plane field for the bubble to move to an equivalent position on an end bar of an adjoining loop, that is, a distance of one period of the access path. The bubbles 102, 104, 106 and 108 are in the storage loops. The bubbles 102–108 in the storage loop also move one period along the storage loop elements as shown.

INDUSTRIAL APPLICABILITY

The device shown in FIGS. 2 through 5 illustrates one close-packed pattern suitable for a high density bubble memory. That device has one access path. Other close-packed bubble devices may be fabricated that have two or more access paths.

Figure 6:
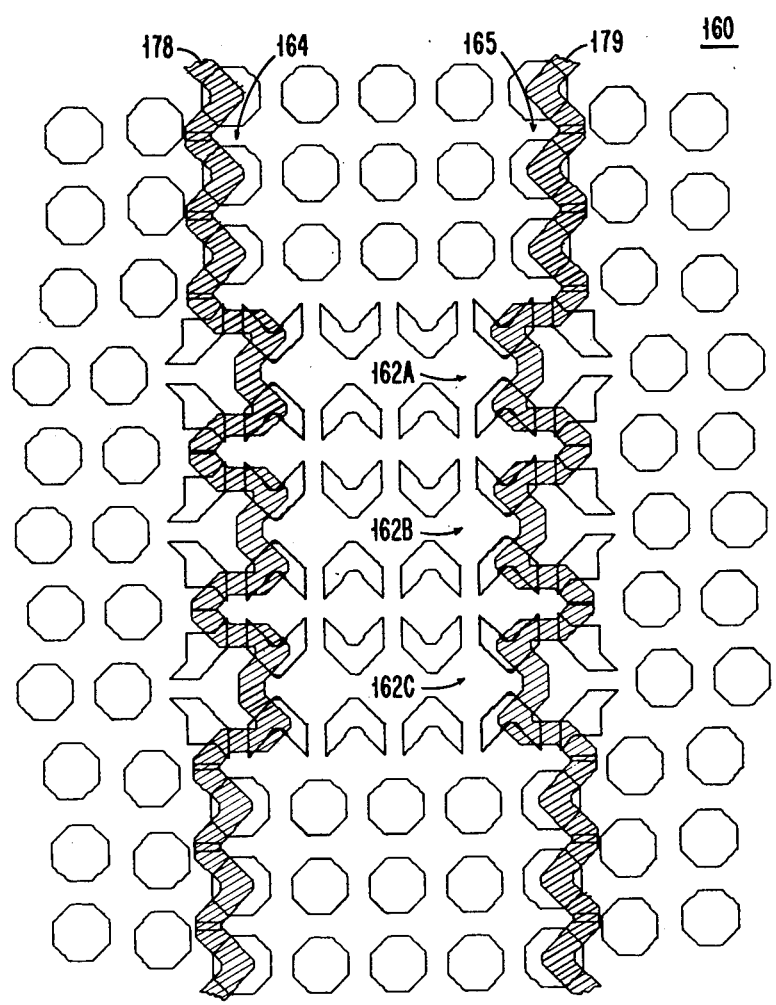
FIG. 6 is an elevational view illustrating a portion of a close-packed bubble device with two access paths.

As shown in FIG. 6, the close-packed bubble device 160 consists of a plurality of storage loops 162A, 162B and 162C and two acess paths 164 and 165. The storage loops 162A, B and C contain the same arrangement of propagation elements as described in FIG. 3. The access paths 164 and 165 are associated with conductors 178 and 179 respectively. The presence of two access paths reduces the storage capacity of the storage loops that exist when current is passed through the conductor 178 and 179. While access paths 164 and 165 are shown to be at the ends of storage loops 162A-C, it is understood that the access paths may be positioned in other locations in the storage loops.

While I have illustrated and described the preferred embodiment of my invention, it is understood that I do not limit myself to the precise constructions herein disclosed and the right is reserved to all changes and modifications coming within the scope of the invention as defined in the appended claims.

I claim:

1. A close-packed magnetic bubble device comprising
   a plurality of first, second and third propagation elements, said first, second and third elements being spaced to provide a period of less than three bubble diameters;
   at least two first storage loops containing said first, second and third elements;
   a second storage loop consisting of a part of said first loop and containing said second and third elements;
   a first access path in said first loops containing said first and second elements;
   means for applying an in-plane rotating field to said elements; and
   switch means associated with said first and second elements wherein the activation of said switch means and the application of an in-plane rotating field to said elements causes bubbles associated with both first and second elements to propagate along said access path and bubbles associated with second and third elements to propagate around said second storage loops and wherein non-activation of said switch means and the application of an in-plane rotating field to said elements causes bubbles to propagate around said first storage loops.

2. A device as described in claim 1 wherein said switch means includes a conductor associated with said access path.

3. A device as described in claim 1 including bubble generating means and bubble coding means associated with said access path.

4. A device as described in claim 1 including bubble wall state discriminating means and bubble detector means associated with said access path.

5. A device as described in claim 1 wherein said second and third elements include C-bar type elements.

6. A device as described in claim 1 wherein said second and third elements include chevron type type elements.

7. A device as described in claim 1 including a second access path associated with said second loop.

8. A device as described in claim 1 including confinement means surrounding said first loops to confine bubbles in said first loops.

9. A device as described in claim 8 wherein said access path extends through said confinement means.

10. A close-packed magnetic bubble propagation pattern comprising
    a first propagation element in a first row of a first storage loop having first and second rows;
    a second propagation element in said second row of said first loop and opposite said first element;
    a third propagation element in a second storage loop in a third row adjacent said second row, said third element opposite said second element;
    a fourth propagation element in said first row of said first loop adjacent said first element to form a first gap therebetween;
    a fifth propagation element in said second row of said first loop adjacent said second element to form a second gap therebetween, said fifth element opposite said fourth element;
    a sixth propagation element in said second loop adjacent said third element to form a third gap therebetween, said sixth element opposite said fifth element;
    an array of confinement elements surrounding said first and second loops to confine bubbles therein;
    means for applying an in-plane rotating field to said elements; and
    an electrical conductor associated with said propagation elements wherein passing a current through said conductor and the application of an in-plane rotating field to said elements causes bubbles associated with said fourth, fifth and sixth elements to move along said gaps and wherein the absence of current in said conductor and the application of an in-plane rotating field to said elements causes bubbles assocated with said fourth and fifth elements to move in said first loop and bubbles associated with said sixth element to move in said second loop.

11. A pattern as described in claim 10 including a seventh element opposing said first element and said fourth element to form a fourth gap therebetween.

* * * * *